July 9, 1963 B. M. SOSIN ETAL 3,097,343
TRANSISTOR DISTRIBUTED AMPLIFIER
Filed Nov. 28, 1960
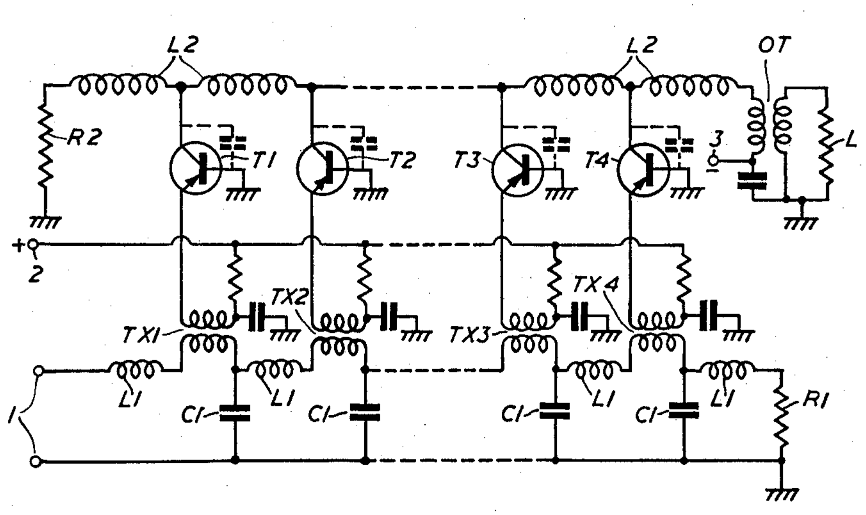
INVENTORS
Boleslaw Marian Sosin
and
Roger Edwin John Gerard
BY Baldwin & Wight
ATTORNEYS United States Patent Office 3,097,343

Patented July 9, 1963

3,097,343

TRANSISTOR DISTRIBUTED AMPLIFIER

Boleslaw Marian Sosin, Great Baddow, and Roger Edwin John Gerard, Chiswick, London, England, assignors to Marconi's Wireless Telegraph Company Limited, London, England, a British company Filed Nov. 28, 1960, Ser. No. 72,202
Claims priority, application Great Britain Feb. 9, 1960
6 Claims. (Cl. 330—30)

This invention relates to wide band amplifiers and more particularly to such amplifiers of the kind known as "distributed" amplifiers, i.e. amplifiers in which a plurality of amplifying devices are so connected that their output electrode capacities form, at least in part, shunt arms of an output filter line or chain, while their input electrodes are fed in such phase relative to one another with input signals from an input filter line that the amplified signals from all the devices add in phase at the output.

Distributed amplifiers using vacuum tubes are, of course, well known but there are obvious advantages to be gained by replacing vacuum tubes by transistors due to their lower power requirements, weight and bulk. However, vacuum tubes cannot be directly replaced by transistors in a distributed amplifier as the transistors, being low voltage, high current devices as opposed to vacuum tubes which are high voltage, low current devices, would so load the input filter line as to render their use impracticable.

It is the object of the present invention to provide transistor distributed amplifiers in which the above mentioned difficulty is overcome.

According to this invention in its broadest aspect an amplifier of the kind referred to comprises a plurality of transistors each connected to receive signals from the input filter line by means of a current transformer.

According to a feature of this invention a transistor distributed amplifier comprises an input filter line, a plurality of current transformers having their primary windings connected in series with said input filter line at different points therein, an output filter line having shunt arms thereof constituted at least in part by transistor electrode capacities, a plurality of transistors having their input electrodes connected to receive signals from the secondary windings of different ones of said transformers and their output electrodes connected to different points along the output filter line, said last mentioned points being so chosen that the delays along the output filter line between said output electrodes are substantially equal to the delays along the input filter line between corresponding input electrodes, means for applying signals to said input filter line and means for taking output from said output filter line.

Preferably the winding ratios of the current transformers are graded in such manner that all the transistors receive substantially equal input currents.

The invention is illustrated in and further described with reference to the accompanying drawing which shows diagrammatically one embodiment thereof.

Referring to the drawing, input signals to be amplified are fed at terminals 1, via a matching network (not shown) if required, to an input filter line or chain comprising similar series arms constituted by the coils L1 and similar shunt arms including the condensers C1 connected at points between the coils L1. The filter line is correctly terminated by the resistance R1.

Current transformers TX1, TX2, TX3 and TX4 have their primary windings connected in series as shown between adjacent pairs of coils L1, and each transformer has one end of its secondary winding connected to the emitter of one of the transistors T1, T2, T3 or T4 and the other end connected, via a suitable decoupling network, to a source of D.C. potential (not shown) connected at terminal 2. The winding ratios which should be adopted for the current transformers depend of course, on the circuit characteristics of individual amplifier arrangements. The load transferred from the transformer secondary into the input filter line will normally be small so far as the frequency response of the line is concerned but, in some cases, account may have to be taken of this load in designing the filter line.

Each of the transistors T1, T2, T3 and T4 has its base earthed and its collector connected at an appropriate point on an output filter line or chain having its series arms constituted by similar coils L2 and its shunt arms constituted solely by the collector-base capacities, represented as condensers in broken lines, of the transistors. The output filter line is correctly terminated at one end by a resistance R2 and is connected at the other end via an output transformer OT to the load L. The connection points of the collector electrodes of transistors T1, T2, T3 and T4 with the output filter line are chosen in accordance with well known principles in connection with vacuum tube distributed amplifiers, so that the delays along the output filter line between adjacent collector electrodes are equal to the delays along the input filter line between corresponding emitter electrodes. A suitable source of D.C. potential (not shown) is connected to the output filter line, and hence to the transistor collectors, via the terminal 3 and is decoupled as shown. The base of each of the transistors is earthed.

The input and output filter lines are arranged to have suitable pass bands for the range of frequencies to be amplified but as the design of such filters is well understood in the art it is not thought necessary to give any further description here.

Although ideally all the current transformers should have the same winding ratios, in practice, due to the load imposed by the transistors on the input filter line, the signal current along the line decreases from the input end and the winding ratios of the transformers are varied along the line so that the signal current fed to the emitters of all the transistors is substantially the same.

As will be apparent, with the arrangement described, the collector signal currents of the transistors will add in phase towards the load L and will provide output over a wide band of frequencies due to the fact that the collector-base capacities of the transistors do not add in parallel but form the shunt arms of the output filter line. Clearly, if desired, additional condensers may be connected in parallel with the transistor collector-base capacities. Furthermore, the output filter line may have further shunt arms to which the electrode capacities of the transistor do not contribute.

We claim:

1. A transistor distributed amplifier comprising an input filter line, a plurality of transformers providing current transformation between their primary and secondary windings and having their primary windings connected in series with said input filter line at different points therein, an output filter line having shunt arms thereof constituted at least in part by transistor electrode capacities, a plurality of transistors having their input electrodes connected to receive signals from the secondary windings of different ones of said transformers and their output electrodes connected to different points along the output filter line, said last mentioned points being so chosen that the delays along the output filter line between said output electrodes are substantially equal to the delays along the input filter line between corresponding input electrodes, means for applying signals to said input filter line and means for taking output from said output filter line.

2. An amplifier as claimed in claim 1 wherein the winding ratios of the transformers are graded in such manner that all the transistors receive substantially equal input currents.

3. An amplifier as claimed in claim 1 wherein said input filter line has similar series arms constituted by inductances and similar shunt arms including condensers connected at points between said inductances, each individual primary being connected between a different pair of said inductances; each of said plurality of transistors having its emitter fed from a different one of the transformer secondaries and its base earthed; and said output filter line comprises series inductances and shunt arms constituted by the collector-base capacities of the transistors each of which has its collector connected to a point between a different pair of inductances in the output line.

4. A transistor distributed amplifier comprising an input filter line, a plurality of transformers providing current transformation between their primary and secondary windings and having their primary windings connected in series with said input filter line at different points therein, an output filter line, a plurality of transistors having their input electrodes connected to receive signals from the secondary windings of different ones of said transformers and their output electrodes connected to different points along the output filter line, said last mentioned points being so chosen that the delays along the output filter line between said output electrodes are substantially equal to the delays along the input filter line between corresponding input electrodes.

5. An amplifier as claimed in claim 4 wherein said transformers have winding ratios which are graded in such manner that all the transistors receive substantially equal input currents.

6. An amplifier as claimed in claim 4, said input filter line having similar series arms constituted by inductances and similar shunt arms including condensers connected at points between said inductances; each individual primary being connected between a different pair of said inductances; each of said plurality of transistors having emitter electrodes as the input electrodes and base electrodes which are earthed; said output filter line comprising series inductances and shunt arms constituted by the collector-base capacities of the transistors, each transistor having a collector electrode connected to a point between a different pair of inductances in the output line.

References Cited in the file of this patent

UNITED STATES PATENTS

| | | |
|---|---|---|
| 2,942,199 | Lee | June 21, 1960 |
| 2,957,143 | Enloe | Oct. 18, 1960 |

FOREIGN PATENTS

| | | |
|---|---|---|
| 1,060,927 | Germany | July 9, 1950 |